United States Patent
Tomizawa et al.

(10) Patent No.: US 8,937,331 B2
(45) Date of Patent: Jan. 20, 2015

(54) SEMICONDUCTOR LIGHT EMITTING DEVICE

(71) Applicant: Kabushiki Kaisha Toshiba, Tokyo (JP)

(72) Inventors: Hideyuki Tomizawa, Kanagawa-ken (JP); Akihiro Kojima, Kanagawa-ken (JP); Miyoko Shimada, Kanagawa-ken (JP); Yosuke Akimoto, Tokyo (JP); Yoshiaki Sugizaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/847,643

(22) Filed: Mar. 20, 2013

(65) Prior Publication Data

US 2014/0203313 A1  Jul. 24, 2014

(30) Foreign Application Priority Data

Jan. 21, 2013 (JP) ................. 2013-008809

(51) Int. Cl.
*H01L 33/50* (2010.01)

(52) U.S. Cl.
CPC ............ *H01L 33/502* (2013.01); *H01L 33/504* (2013.01)
USPC .......................................................... 257/98

(58) Field of Classification Search
CPC ....... H01L 33/38; H01L 33/44; H01L 33/486; H01L 33/50; H01L 33/502; H01L 33/507
See application file for complete search history.

(56) References Cited

U.S. PATENT DOCUMENTS

| | | |
|---|---|---|
| 2004/0012027 A1 | 1/2004 | Keller et al. |
| 2005/0093430 A1 | 5/2005 | Ibbetson et al. |
| 2008/0179611 A1 | 7/2008 | Chitnis et al. |
| 2011/0147775 A1* | 6/2011 | Hikosaka et al. ............... 257/98 |
| 2011/0233585 A1* | 9/2011 | Kojima et al. .................. 257/98 |
| 2011/0297987 A1* | 12/2011 | Koizumi et al. ................ 257/98 |
| 2011/0297995 A1 | 12/2011 | Akimoto et al. |
| 2011/0300644 A1 | 12/2011 | Akimoto et al. |
| 2012/0097972 A1 | 4/2012 | Sugizaki et al. |
| 2013/0169149 A1* | 7/2013 | Sato et al. ..................... 313/512 |

* cited by examiner

*Primary Examiner* — Whitney T Moore
(74) *Attorney, Agent, or Firm* — Holtz, Holtz, Goodman & Chick PC

(57) ABSTRACT

According to one embodiment, a semiconductor light emitting device includes: a mounting substrate; a semiconductor light emitting element; a first resin; and a second resin. The semiconductor light emitting element includes: a semiconductor layer including a light emitting layer; a p-side electrode; a p-side interconnection unit; an n-side electrode; and an n-side interconnection unit. The first resin covers a periphery of the semiconductor light emitting element on the substrate and contains a phosphorescent substance capable of being excited by emission light of the light emitting layer. The second resin is provided on the first resin layer and the semiconductor light emitting element and contains a fluorescent body capable of being excited by emission light of the light emitting layer to emit light of a different peak wavelength from emission light of the light emitting layer.

14 Claims, 16 Drawing Sheets

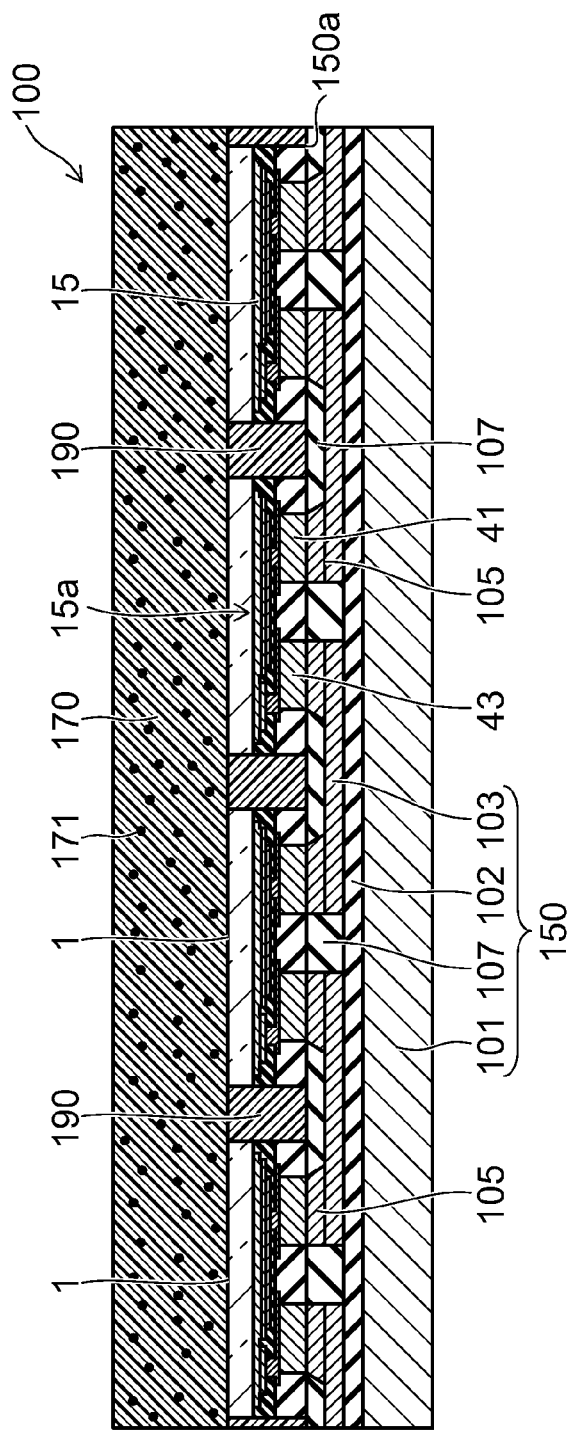
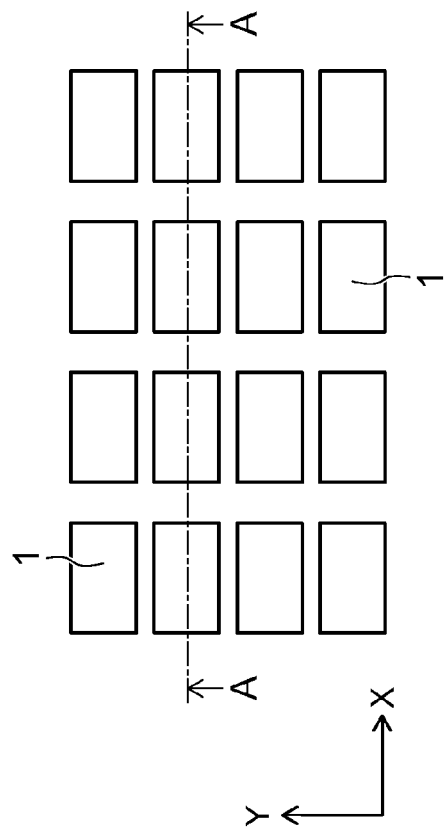
FIG. 1A
FIG. 1B

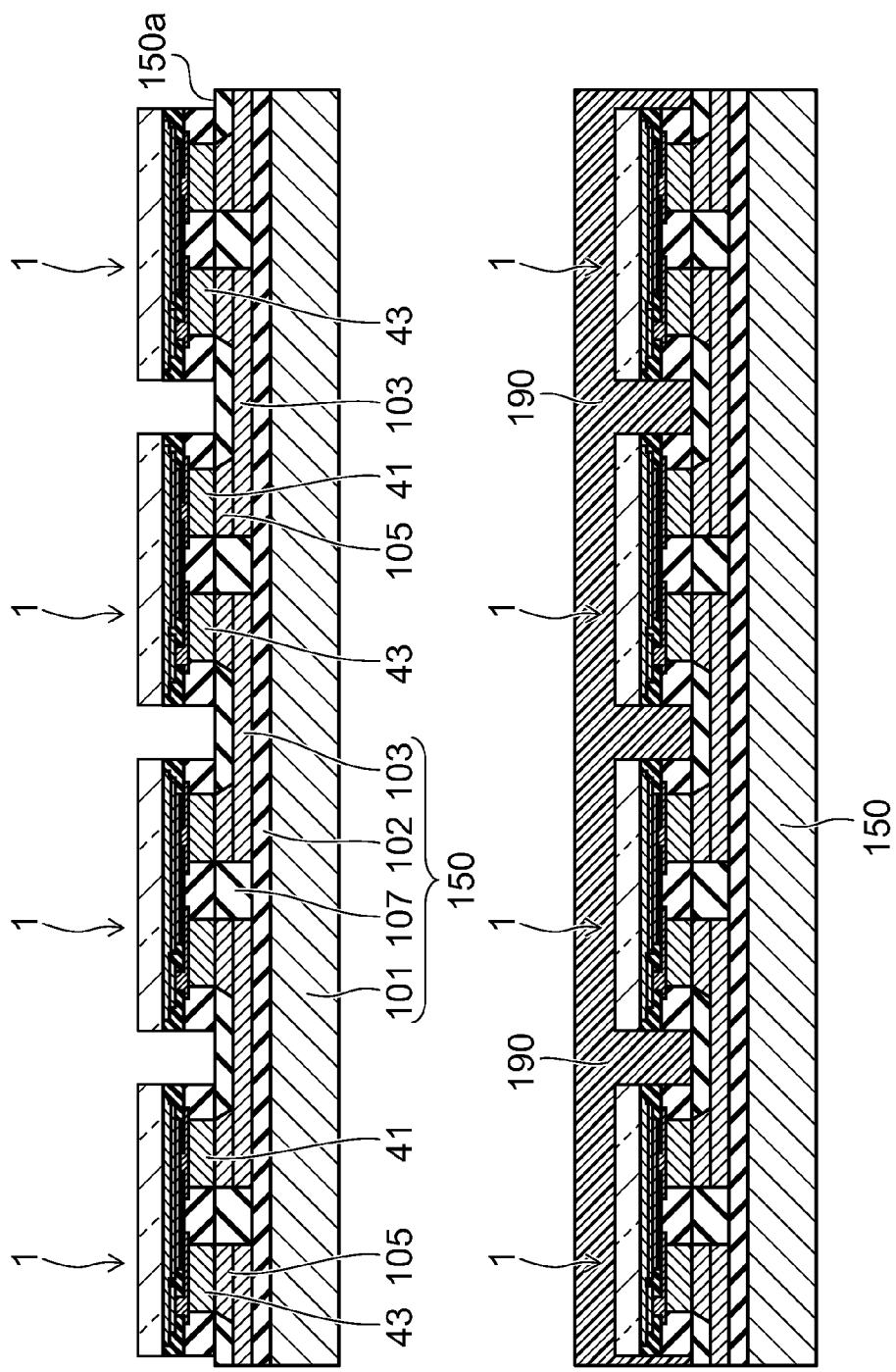

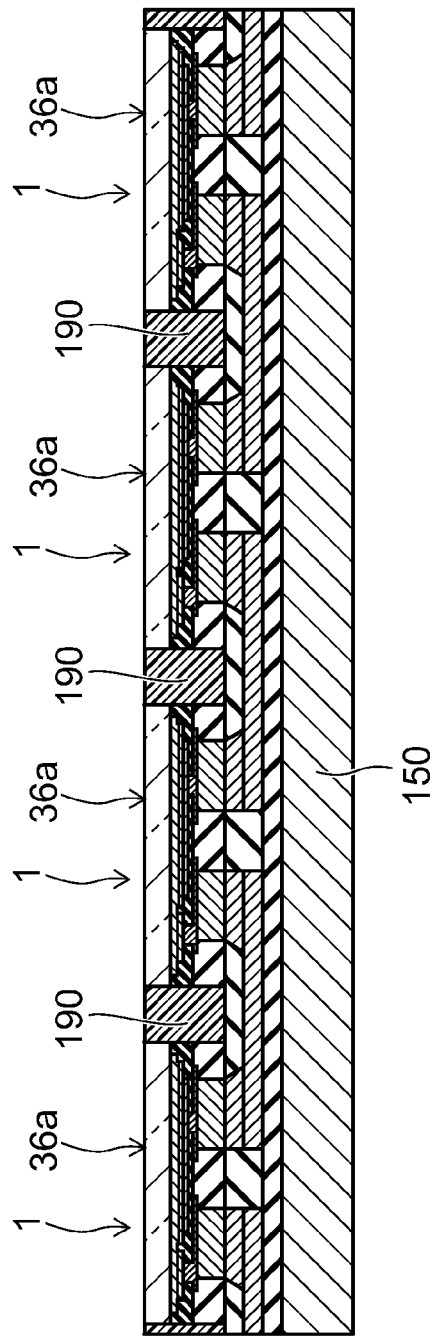
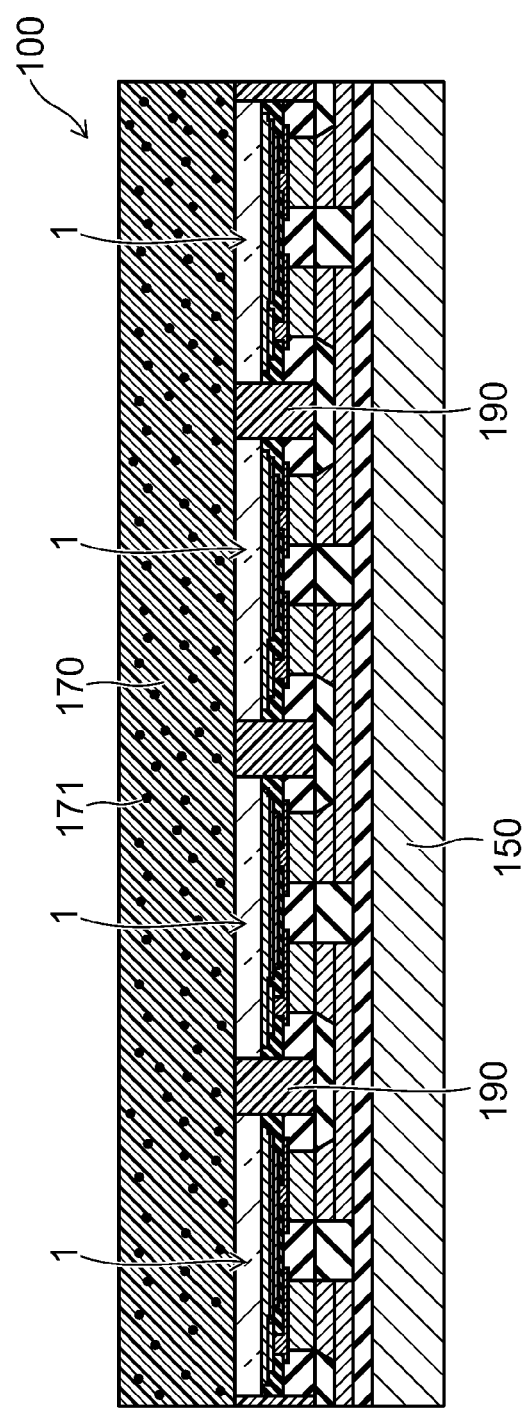
FIG. 4A
FIG. 4B

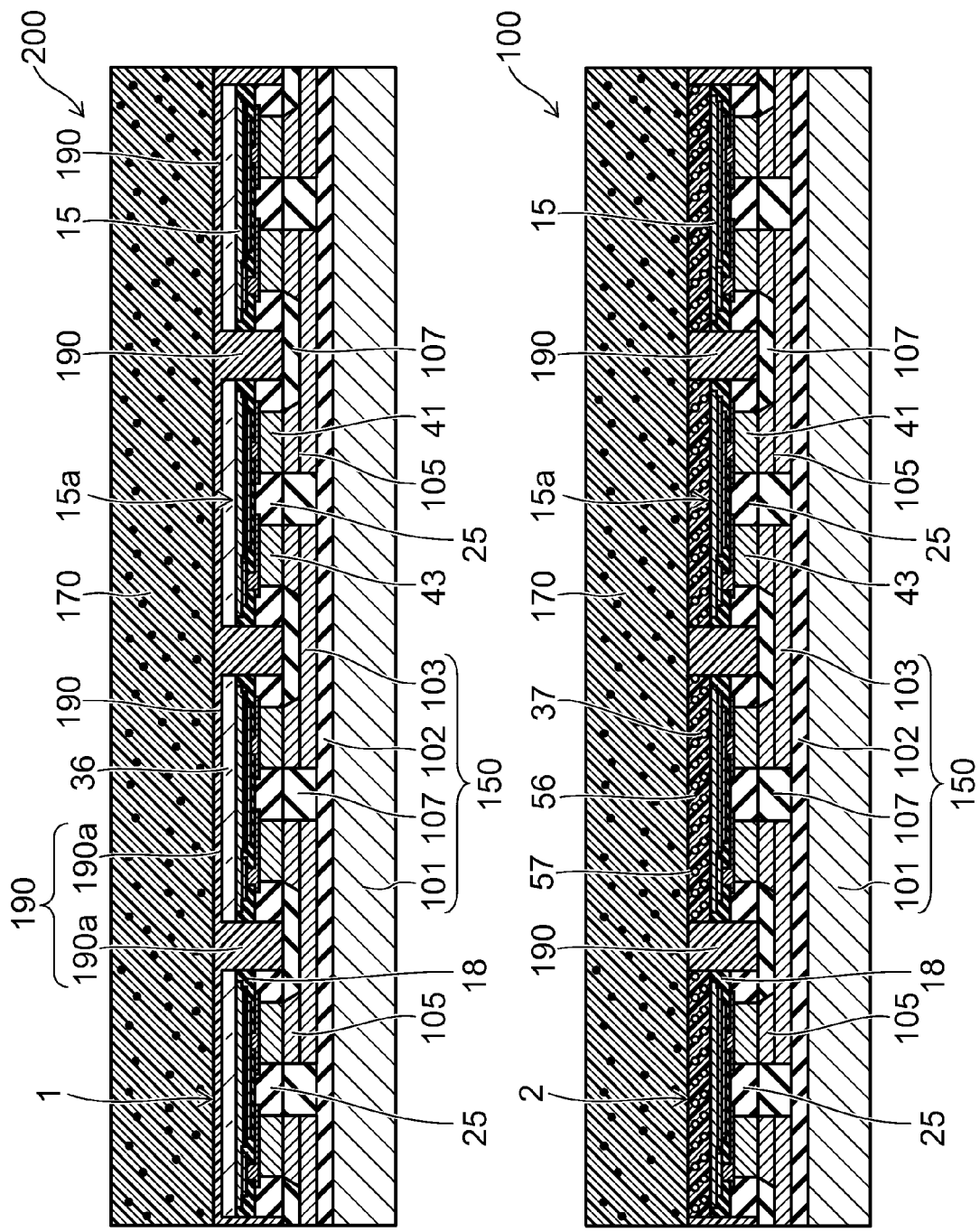

SEMICONDUCTOR LIGHT EMITTING DEVICE

CROSS-REFERENCE TO RELATED APPLICATIONS

This application is based upon and claims the benefit of priority from the prior Japanese Patent Application No. 2013-008809, filed on Jan. 21, 2013; the entire contents of which are incorporated herein by reference.

FIELD

Embodiments described herein relate generally to a semiconductor light emitting device.

BACKGROUND

A semiconductor light emitting device that emits visible light such as white light or light in other wavelength ranges by combining a semiconductor light emitting element and a fluorescent body is expanding the use as a small, easy-to-handle light source. In general, a DC power source is used to drive such a semiconductor light emitting device. However, to reduce the manufacturing costs, there is also a case where a rectifying circuit is omitted to drive the device directly using an AC power source.

BRIEF DESCRIPTION OF THE DRAWINGS

FIGS. 1A and 1B are schematic views showing a semiconductor light emitting device according to an embodiment;

FIG. 3A to FIG. 4B are schematic cross-sectional views showing manufacturing processes of the semiconductor light emitting device according to the embodiment;

FIG. 6A and FIG. 6B are schematic cross-sectional views showing semiconductor light emitting devices according to modification examples of the embodiment;

DETAILED DESCRIPTION

Figure 2:
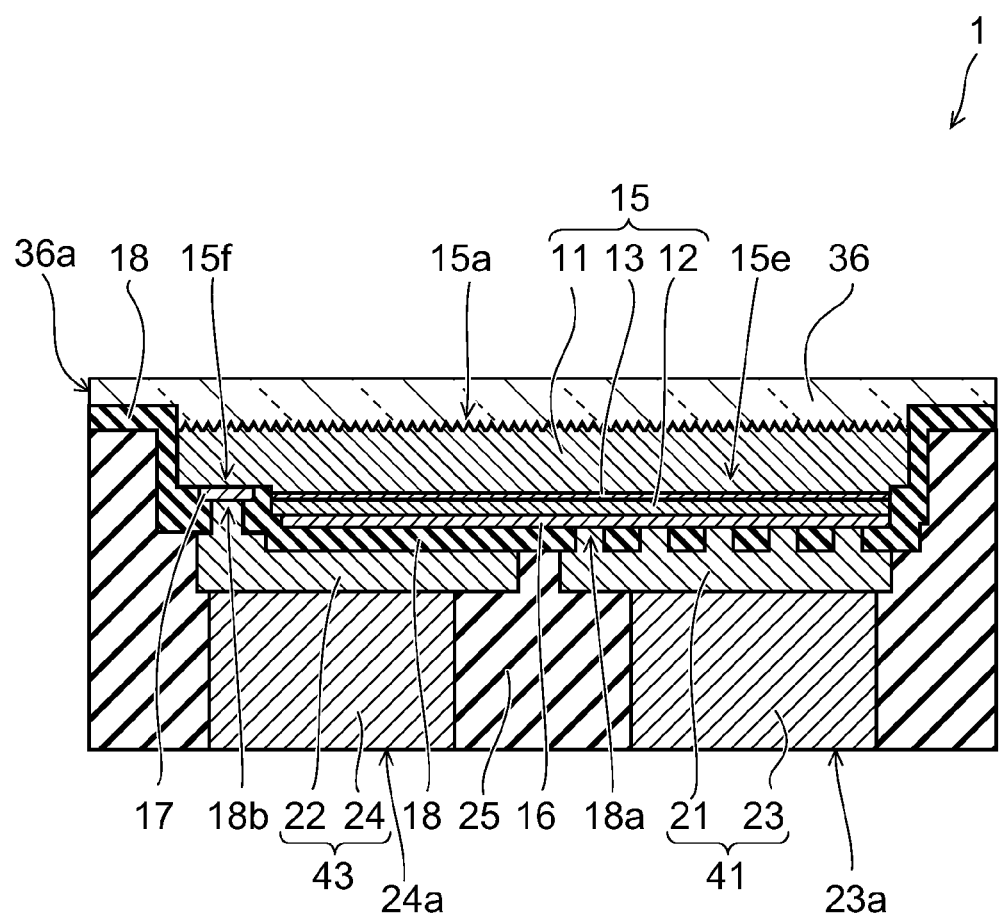
FIG. 2 is a schematic cross-sectional view showing the semiconductor light emitting element according to the embodiment.

According to one embodiment, a semiconductor light emitting device includes: a mounting substrate having a mounting surface provided with a plurality of interconnections; a semiconductor light emitting element disposed on the mounting surface and including: a semiconductor layer including a light emitting layer; a p-side electrode connected to the semiconductor layer; a p-side interconnection unit connecting the p-side electrode and one of the plurality of interconnections; an n-side electrode connected to the semiconductor layer; and an n-side interconnection unit connecting the n-side electrode and another of the plurality of interconnections; a first resin covering a periphery of the semiconductor light emitting element on the mounting surface and containing a phosphorescent substance capable of being excited by emission light of the light emitting layer; and a second resin provided on the first resin layer and the semiconductor light emitting element and containing a fluorescent body capable of being excited by emission light of the light emitting layer to emit light of a different peak wavelength from emission light of the light emitting layer.

Hereinbelow, embodiments are described with reference to the drawings. Identical components in the drawings are marked with the same reference numerals, and a detailed description thereof is omitted as appropriate and different components are described.

FIGS. 1A and 1B are schematic views showing a semiconductor light emitting device 100 according to an embodiment. The semiconductor light emitting device 100 includes a mounting substrate 150 having a mounting surface 150a and a semiconductor light emitting element 1 disposed on the mounting surface 150a. A plurality of interconnections 103 are provided at the mounting surface 150a.

The semiconductor light emitting element 1 includes a semiconductor layer 15 including a light emitting layer 13 (see FIG. 2). The semiconductor light emitting element 1 further includes a p-side electrode 16 (see FIG. 2) provided on the semiconductor layer 15 and a p-side interconnection unit 41 connecting the p-side electrode 16 and one of the plurality of interconnections 103. The semiconductor light emitting element 1 further includes an n-side electrode 17 (see FIG. 2) provided on the semiconductor layer 15 and an n-side interconnection unit 43 connecting the n-side electrode 17 and another of the plurality of interconnections 103.

The semiconductor layer 15 has a first surface 15a that emits the emission light of the light emitting layer 13 and a second surface 15b on the opposite side to the first surface 15a. The p-side interconnection unit 41 and the n-side interconnection unit 43 are provided on the second surface side. The semiconductor light emitting element 1 is mounted such that the second surface side is opposed to the mounting surface 150a, and emits the emission light of the light emitting layer 13 from the first surface 15a.

The semiconductor light emitting device 100 includes a first resin (hereinafter, a resin layer 190) covering the periphery of the semiconductor light emitting element 1 on the mounting surface 150a and a second resin (hereinafter, a resin layer 170) provided on the first resin layer and the semiconductor light emitting element 1.

The resin layer 190 contains a phosphorescent substance that is excited by the emission light of the light emitting layer 13. The resin layer 170 contains fluorescent bodies 171. The fluorescent body 171 is excited by the light emitted from the light emitting layer 13, and emits light of a different peak wavelength from the emission light of the light emitting layer 13.

The phosphorescent substance contained in the resin layer 190 has a longer light emission time than the fluorescent body 171. For example, the light emission of the fluorescent body 171 disappears in 50 to 60 nanoseconds (ns) after the excitation light disappears (for example, becomes an intensity of 1/e. e: the Napier's constant). On the other hand, the light emission of the phosphorescent substance still continues after the light emission of the fluorescent body 171 is lost. Thereby, a change over time in the luminescence intensity of the semiconductor light emitting device 100 can be suppressed. For example, when the semiconductor light emitting device 100 is driven using an AC power source, the flicker of light emission can be suppressed, and the color unevenness of emission light can be suppressed.

The peak wavelength of the emission light of the phosphorescent substance contained in the resin layer 190 is longer than the peak wavelength of the emission light of the light emitting layer 13. The peak wavelength of the emission light of the phosphorescent substance is preferably the same as the peak wavelength of the emission light of the fluorescent body 171. Here, the peak wavelength of the emission light of the phosphorescent substance being the same as the peak wavelength of the emission light of the fluorescent body 171 includes not only strict agreement but also the case of being a wavelength close to the peak wavelength of the emission light of the fluorescent body 171.

Next, the structure of the semiconductor light emitting element 1 is described with reference to FIG. 2. FIG. 2 is a schematic cross-sectional view showing the semiconductor light emitting element 1 according to the embodiment.

The semiconductor light emitting element 1 includes the semiconductor layer 15 including the light emitting layer 13. The semiconductor layer 15 has the first surface 15a and the second surface 15b on the opposite side to it (see FIG. 9A). The semiconductor layer 15 has a portion 15e including the light emitting layer 13 and a portion 15f not including the light emitting layer 13.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The portion 15e including the light emitting layer 13 is a portion of the semiconductor layer 15 where the light emitting layer 13 is stacked. The portion 15f not including the light emitting layer 13 is a portion of the semiconductor layer 15 where the light emitting layer 13 is not stacked.

The first semiconductor layer 11 includes, for example, an underlying buffer layer and an n-type GaN layer. The second semiconductor layer 12 is, for example, a p-type GaN layer. The light emitting layer 13 contains a material that emits blue light, violet light, bluish violet light, ultraviolet light, etc.

The second surface 15b of the semiconductor layer 15 is fashioned in an uneven form. The convex portion of the unevenness is the portion 15e including the light emitting layer 13, and the concave portion is the portion 15f not including the light emitting layer 13. The second surface of the portion 15e including the light emitting layer 13 is a surface of the second semiconductor layer 12, and the p-side electrode 16 is provided thereon. The second surface of the portion 15f not including the light emitting layer 13 is a surface of the first semiconductor layer 11, and the n-side electrode 17 is provided thereon.

The light emitting layer 13 emits light by passing a current between the p-side electrode 16 and the n-side electrode 17. The emission light of the light emitting layer 13 is emitted to the outside from the first surface 15a.

In the second surface 15b of the semiconductor layer 15, for example, the area of the portion 15e including the light emitting layer 13 is provided larger than the area of the portion 15f not including the light emitting layer 13. The area of the p-side electrode 16 provided on the portion 15e including the light emitting layer 13 is larger than the area of the n-side electrode 17 provided on the portion not including the light emitting layer 13. Thereby, a large light emitting surface is obtained, and the light output can be increased.

A first insulating film (hereinafter, an insulating film 18) is provided on the second surface side of the semiconductor layer 15. The insulating film 18 covers the semiconductor layer 15, the p-side electrode 16, and the n-side electrode 17. The insulating film 18 is not provided on the first surface 15a of the semiconductor layer 15.

As the insulating film 18, for example, an inorganic film such as a silicon oxide film and a silicon nitride film is used. Alternatively, a resin such as a polyimide excellent in the patternability of minute openings may be used. In the case where a resin is used as the insulating film 18, for example, an inorganic film such as a silicon oxide film may be provided between the insulating film 18 and the semiconductor layer 15. The inorganic film covers and protects the side surfaces of the light emitting layer 13 and the second semiconductor layer 12.

In the specification, "cover" includes not only the case where a covering matter is in contact with a covered matter but also the case where a covering matter covers a covered matter via another matter.

On a surface of the insulating film 18 on the opposite side to the semiconductor layer 15, a p-side interconnection layer 21 and an n-side interconnection layer 22 are provided away from each other. The insulating film 18 includes a first opening (hereinafter, an opening 18a) leading to the p-side electrode 16 and a second opening (hereinafter, an opening 18b) leading to the n-side electrode 17. Although the insulating film 18 includes a plurality of openings 18a in the example shown in FIG. 1, also a configuration including one opening is possible.

The p-side interconnection layer 21 is provided on the insulating film 18 and also in the opening 18a. That is, the p-side interconnection layer 21 is electrically connected to the p-side electrode 16 via the opening 18a. The n-side interconnection layer 22 is provided on the insulating film 18 and also in the opening 18b, and is electrically connected to the n-side electrode 17.

A p-side metal pillar 23 is provided on a surface of the p-side interconnection layer 21 on the opposite side to the p-side electrode 16. The p-side interconnection unit 41 includes the p-side interconnection layer 21 and the p-side metal pillar 23.

An n-side metal pillar 24 is provided on a surface of the n-side interconnection layer 22 on the opposite side to the n-side electrode 17. The n-side interconnection unit 43 includes the n-side interconnection layer 22 and the n-side metal pillar 24.

A second insulating film (hereinafter, an insulating film 25) is provided between the p-side interconnection unit 41 and the n-side interconnection unit 43. That is, the insulating film 25 is put in between the p-side metal pillar 23 and the n-side metal pillar 24, and covers the insulating film 18, the side surface of the p-side interconnection unit 41, and the side surface of the n-side interconnection unit 43.

As shown in FIGS. 1A and 1B, the insulating film 25 covers the side surface of the p-side metal pillar 23 and the side surface of the n-side metal pillar 24. On the other hand, a surface of the p-side metal pillar 23 on the opposite side to the p-side interconnection layer 21 is exposed from the insulating film 25, and functions as a p-side external terminal 23a. A surface of the n-side metal pillar 24 on the opposite side to the n-side interconnection layer 22 is exposed from the insulating film 25, and functions as an n-side external terminal 24a.

Thus, the p-side external terminal 23a and the n-side external terminal 24a are exposed at the same surface (the lower surface in FIGS. 1A and 1B) of the insulating film 25. The spacing between them is preferably set wider than the spacing between the p-side interconnection layer 21 and the n-side interconnection layer 22 on the insulating film 18. That is, the spacing between the p-side external terminal 23a and the n-side external terminal 24a is, for example, set larger than the spread of a solder in the time of mounting. Thereby, a short circuit between the p-side external terminal 23a and the n-side external terminal 24a can be prevented.

In contrast, the spacing between the p-side interconnection layer 21 and the n-side interconnection layer 22 may be set narrow up to the limit in terms of processes. The area of the p-side interconnection layer 21 is expanded, and the contact area between the p-side interconnection layer 21 and the p-side metal pillar 23 is enlarged. Thereby, the heat dissipation of the light emitting layer 13 is promoted.

The area with which the p-side interconnection layer 21 is in contact with the p-side electrode 16 via the plurality of openings 18a is set larger than the area with which the n-side interconnection layer 22 is in contact with the n-side electrode 17 via the opening 18b. Thereby, the distribution of the current flowing through the light emitting layer 13 can be equalized.

The area of the n-side interconnection layer 22 provided on the insulating film 18 may be set larger than the area of the n-side electrode 17. The area of the n-side metal pillar 24 provided on the n-side interconnection layer 22 (that is, the area of the n-side external terminal 24a) may be larger than the n-side electrode 17. Thereby, the area of the n-side electrode 17 can be made small while the area of the n-side external terminal 24a necessary for mounting is kept. For example, the area of the portion 15f not including the light emitting layer 13 of the semiconductor layer 15 is reduced, and the area of the portion 15e including the light emitting layer 13 is expanded; thereby, the light output can be increased.

The first semiconductor layer 11 is electrically connected to the n-side metal pillar 24 via the n-side electrode 17 and the n-side interconnection layer 22. The second semiconductor layer 12 is electrically connected to the p-side metal pillar 23 via the p-side electrode 16 and the p-side interconnection layer 21.

The p-side metal pillar 23 is thicker than the p-side interconnection layer 21, and the n-side metal pillar 24 is thicker than the n-side interconnection layer 22, for example. Each of the thicknesses of the p-side metal pillar 23, the n-side metal pillar 24, and the insulating film 25 may be thicker than the semiconductor layer 15. The "thickness" herein is the width of each layer in the vertical direction in FIG. 2.

Each of the thicknesses of the p-side metal pillar 23 and the n-side metal pillar 24 may be thicker than the thickness of the stacked body including the semiconductor layer 15, the p-side electrode 16, the n-side electrode 17, and the insulating film 18.

The aspect ratio (the ratio of the thickness to the planar size) of the metal pillars 23 and 24 is arbitrary; for example, it may be 1 or more or smaller than 1. That is, the metal pillars 23 and 24 may be either thicker or thinner than the planar size thereof.

By the embodiment, even when a substrate 10 (see FIGS. 8A to 8C) used for forming the semiconductor layer 15 is removed, the semiconductor layer 15 is stably supported by the p-side metal pillar 23, the n-side metal pillar 24, and the insulating film 25. Therefore, the mechanical strength of the semiconductor light emitting element 1 can be kept at a level to withstand the processing after the substrate 10 is removed.

As the material of the p-side interconnection layer 21, the n-side interconnection layer 22, the p-side metal pillar 23, and the n-side metal pillar 24, for example, copper, gold, nickel, silver, and the like may be used. Of these, when copper is used, good thermal conductivity and high migration resistance can be obtained, and the adhesion to insulating materials can be improved.

The insulating film 25 reinforces the p-side metal pillar 23 and the n-side metal pillar 24. For the insulating film 25, a material with a thermal expansion coefficient equal or close to that of the mounting substrate is preferably used. As such a material of the insulating film 25, for example, an epoxy resin, a silicone resin, a fluorine resin, and the like may be given.

In the process of mounting the semiconductor light emitting element 1, the stress due to the member, such as a solder, for connecting the p-side external terminal 23a and the n-side external terminal 24a to the mounting substrate is applied to the semiconductor layer 15, but the p-side metal pillar 23 and the n-side metal pillar 24 absorb and relax the stress.

In the embodiment, the p-side interconnection unit 41 including the p-side interconnection layer 21 and the p-side metal pillar 23 is connected to the p-side electrode 16 via a plurality of vias 21a provided in the plurality of openings 18a away from one another. The stress applied to the semiconductor layer 15 can be more reduced than in the case where, for example, the p-side interconnection unit 41 is connected to the p-side electrode 16 via one via having an area equal to the total of the contact areas of the vias 21a.

On the other hand, the p-side interconnection layer 21 may be connected to the p-side electrode 16 via a post with a larger planar size than the via 21a provided in one large opening. Thereby, heat radiation via the p-side electrode 16, the p-side interconnection layer 21, and the p-side metal pillar 23 can be improved.

As described later, the substrate 10 used for the formation of the semiconductor layer 15 is removed from the semiconductor layer 15. Thereby, the height of the semiconductor light emitting element 1 is reduced. Fine unevenness is formed on the first surface 15a of the semiconductor layer 15 from which the substrate 10 has been removed. For example, wet etching using an alkali-based solution (frost treatment) is performed on the first surface 15a to form unevenness. Thereby, the emission light of the light emitting layer 13 can be extracted to the outside from the first surface 15a without being totally reflected.

The semiconductor light emitting element 1 further includes an insulating layer 36 that is provided on the semiconductor layer 15 and the insulating film 18 on the first surface 15a side and transmits the emission light of the light emitting layer 13. The insulating layer 36 is, for example, an inorganic film such as a silicon oxide film and a silicon nitride film. The insulating layer 36 may be also a resin layer of a silicone resin, an epoxy resin, or the like.

Next, the manufacturing processes of the semiconductor light emitting device 100 are described with reference to FIGS. 3A and 3B and FIGS. 4A and 4B. FIG. 3A to FIG. 4B are schematic cross-sectional views showing the manufacturing processes of the semiconductor light emitting device 100 according to the embodiment.

First, as shown in FIG. 3A, a plurality of semiconductor light emitting elements 1 are mounted on the mounting surface 150a of the mounting substrate 150. The mounting substrate 150 includes, for example, a metal base 101, an insulating layer 102 provided on the metal base 101, and a plurality of interconnections 103 provided on the insulating layer 102. The mounting substrate 150 includes a solder resist 107 covering the interconnection 103 and the insulating layer 102.

The semiconductor light emitting element 1 is mounted while a surface of the insulating film 25 exposing the p-side interconnection unit 41 and the n-side interconnection unit 43 is opposed to the mounting surface 150a. Then, the p-side interconnection unit 41 and the n-side interconnection unit 43 are connected to the interconnection 103 via, for example, a solder 105. In the embodiment, for example, the plurality of semiconductor light emitting elements 1 are connected in series via the interconnections 103. That is, between adjacent semiconductor light emitting elements 1, the p-side interconnection unit 41 of one semiconductor light emitting element 1 is connected to the n-side interconnection unit 43 of the other semiconductor light emitting element 1 via a common interconnection 103.

Next, as shown in FIG. 3B, the resin layer 190 is formed that covers the plurality of semiconductor light emitting elements 1 mounted on the mounting substrate 150 and the mounting surface 150a between adjacent semiconductor light emitting elements 1. The resin layer 190 is, for example, a silicone resin and contains a phosphorescent substance. A metal complex of iridium or the like, for example, may be used as the phosphorescent substance.

Next, as shown in FIG. 4A, portions of the resin layer 190 formed on the semiconductor light emitting elements 1 are removed, and the resin layer 190 is left between adjacent semiconductor light emitting elements 1. For example, the resin layer 190 formed on the semiconductor light emitting element 1 is removed by grinding.

Next, as shown in FIG. 4B, the resin layer 170 is formed on the semiconductor light emitting elements 1 and the resin layer 190; thus, the semiconductor light emitting device 100 is completed. The resin layer 170 is, for example, a silicone resin in which fluorescent bodies 171 are scattered. In the case where the light emitting layer 13 emits blue light, a YAG fluorescent substance or an α-sialon-based fluorescent substance that emits yellow fluorescence, for example, is used for the fluorescent body 171. A nitride-based fluorescent substance that emits green and red fluorescence may be mixed in.

Figure 5:
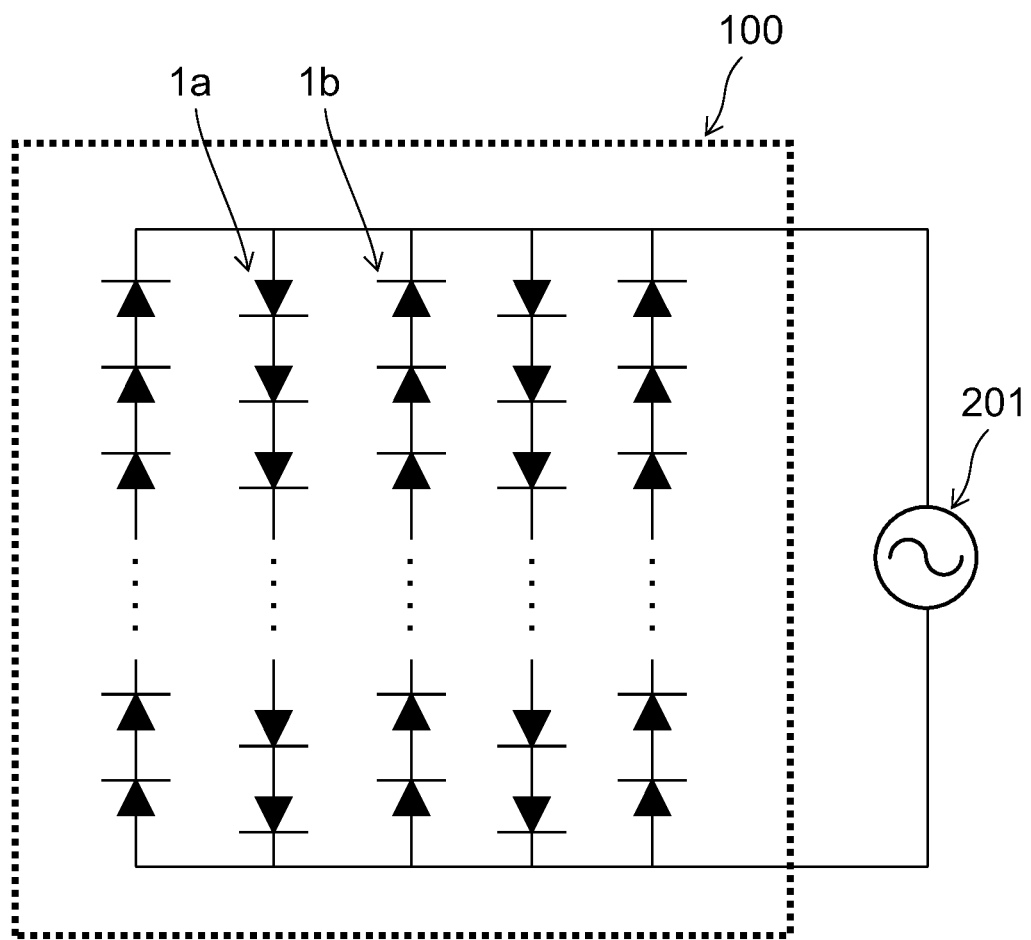
FIG. 5 is a circuit diagram showing the semiconductor light emitting device according to the embodiment.

FIG. 5 is a circuit diagram showing the semiconductor light emitting device 100 according to the embodiment. The semiconductor light emitting device 100 includes, for example, a first light emitting element group in which semiconductor light emitting elements 1a are connected in series and a second light emitting element group in which semiconductor light emitting elements 1b are connected in series.

The first light emitting element group and the second light emitting element group are individually connected in parallel to an AC power source 201. The first light emitting element group is connected to the AC power source 201 in the opposite direction to the second light emitting element group. That is, when the semiconductor light emitting device 100 is driven by the AC power source 201, the first light emitting element group and the second light emitting element group emit light alternately.

In the case where such a drive system is used, for example, a time when the luminance decreases is brought about in the time after the first light emitting element group is turned off until the second light emitting element group is turned on. This is sighted as a flicker or color unevenness. In the embodiment, even when the semiconductor light emitting element 1 is decreased in luminance and is turned off, the light emission of the phosphorescent substance contained in the resin layer 190 provided between adjacent semiconductor light emitting elements 1 continues. Thereby, the semiconductor light emitting device 100 can suppress the flicker of light emission and color unevenness.

FIG. 6A and FIG. 6B are schematic cross-sectional views showing semiconductor light emitting devices 200 and 300 according to modification examples of the embodiment.

The semiconductor light emitting device 200 shown in FIG. 6A includes the mounting substrate 150 and the semiconductor light emitting element 1 disposed on the mounting surface 150a. The semiconductor light emitting device 200 further includes the resin layer 190 covering the entire semiconductor light emitting element 1 mounted on the mounting surface 150a and the resin layer 170 provided on the resin layer 190.

That is, the resin layer 190 has a portion 190a provided around the semiconductor light emitting element 1 and a portion 190b provided on the insulating layer 36. The resin layer 190 contains a phosphorescent substance that is excited by the emission light of the light emitting layer 13. The resin layer 170 contains fluorescent bodies 171 that are excited by the light emitted from the light emitting layer 13 and emit light of a different wavelength from the excitation light.

As shown in FIG. 6A, for example, the resin layer 190 formed on the insulating layer 36 does not need to be completely removed, and a thin resin layer 190b may remain on the insulating layer 36. In the case where the light emission efficiency of the phosphorescent substance contained in the resin layer 190 is lower than the light emission efficiency of the fluorescent body 171, the thickness of the resin layer 190b is preferably as thin as possible.

The semiconductor light emitting device 300 shown in FIG. 6B includes the mounting substrate 150 and a semiconductor light emitting element 2 disposed on the mounting surface 150a. The semiconductor light emitting device 300 further includes the resin layer 190 covering the periphery of the semiconductor light emitting element 2 and the resin layer 170 provided on the semiconductor light emitting element 2 and the resin layer 190.

The semiconductor light emitting element 2 includes the semiconductor layer 15 and the p-side interconnection unit 41 and the n-side interconnection unit 43 provided on the second surface 15b of the semiconductor layer 15. The p-side interconnection unit 41 is electrically connected to the p-side electrode 16 provided on the portion 15e including the light emitting layer 13 of the semiconductor layer 15. The n-side interconnection unit 43 is electrically connected to the n-side electrode 17 provided on the portion 15f not including the light emitting layer 13 of the semiconductor layer 15.

The semiconductor light emitting element 2 further includes an insulating layer 56 provided on the first surface 15a side of the semiconductor layer 15. The insulating layer 56 includes scatterers 57 that scatter the emission light of the light emitting layer 13. A fine particle of silica, for example, may be used as the scatterer 57. The scatterers 57 equalize the distribution of the light emitted from the first surface 15a of the semiconductor layer 15, and widen the orientation angle of the semiconductor light emitting element 1. Thereby, the uniformity of the luminance distribution of the semiconductor light emitting device 300 can be improved.

Figure 7A:
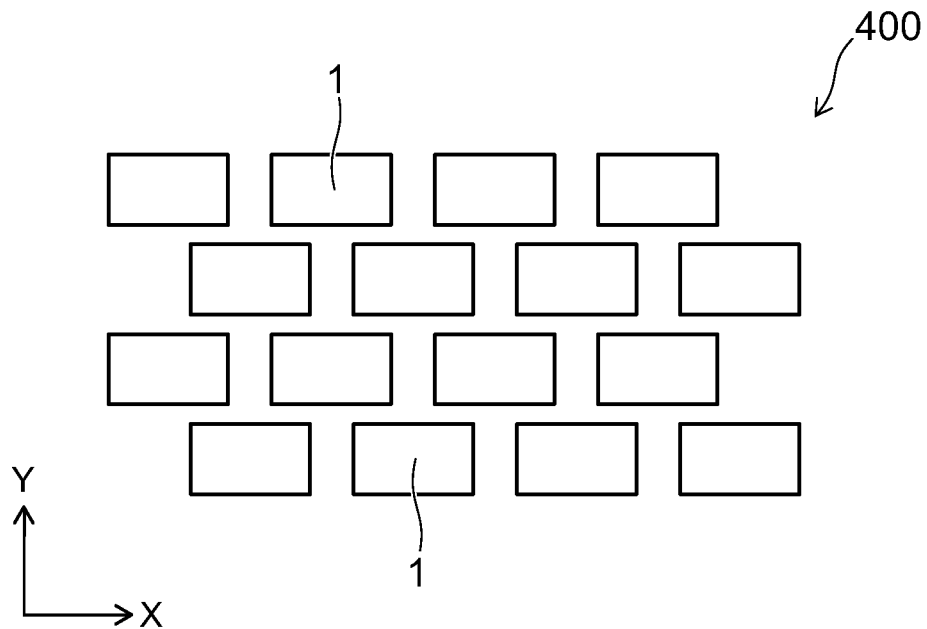
FIG. 7A and FIG. 7B are plan views schematically showing semiconductor light emitting devices according to modification examples of the embodiment.
Figure 7B:
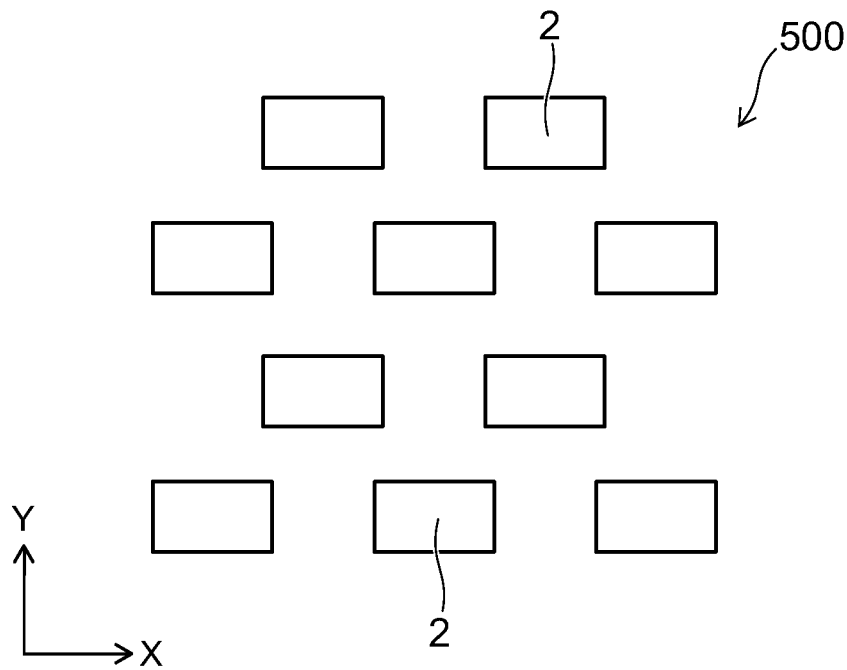

FIG. 7A and FIG. 7B are plan views schematically showing semiconductor light emitting devices 400 and 500 according to modification examples of the embodiment.

The semiconductor light emitting device 400 shown in FIG. 7A includes a plurality of semiconductor light emitting elements 1 arranged in a zigzag fashion on the mounting substrate 150. That is, semiconductor light emitting elements 1 are aligned at equal intervals in the X direction. They are arranged such that the phase of arrangement in the X direction is alternately shifted in the Y direction. By thus arranging the plurality of semiconductor light emitting elements 1, the regularity of the arrangement of light emitting points is put out of order, and light emission unevenness as a surface light source can be suppressed. Furthermore, interference between rays of light emitted from the semiconductor light emitting element 1 in the lateral direction can be suppressed.

The semiconductor light emitting device 500 shown in FIG. 7B includes a plurality of semiconductor light emitting elements 2 arranged in a zigzag fashion on the mounting substrate 150. The semiconductor light emitting element 2 includes the insulating layer 56 including scatterers 57 on the first surface side of the semiconductor layer 15, and the orientation angle is widened. Therefore, the arrangement spacing on the mounting substrate 150 can be widened.

In the example shown in FIG. 7B, the arrangement spacings in the X direction and the Y direction are set wider than the sizes in the respective directions of the semiconductor light emitting element 2. That is, the spacing between adjacent semiconductor light emitting elements 2 is wider than the size of the semiconductor light emitting element 2 in the same arbitrary direction. Thereby, the heat of the semiconductor light emitting element 2 can be dissipated with good efficiency via the mounting substrate 150.

Next, a method for manufacturing the semiconductor light emitting element 1 according to the embodiment is described with reference to FIG. 8A to FIG. 16B. FIG. 8A to FIG. 16B are schematic views showing the manufacturing processes of the semiconductor light emitting element 1 according to the embodiment.

Figure 8A:
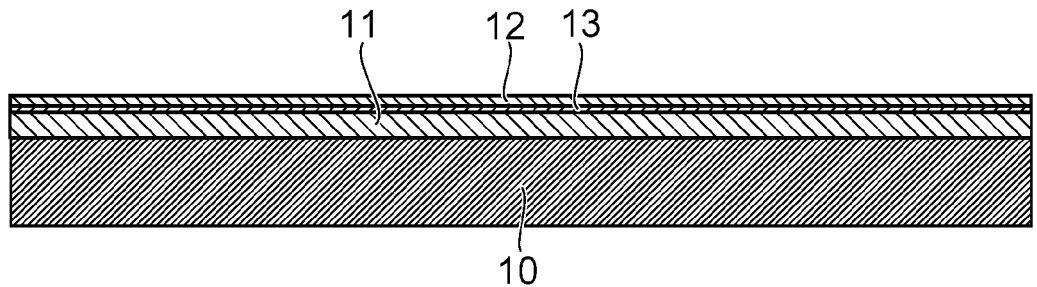
FIG. 8A to FIG. 16B are schematic views showing manufacturing processes of the semiconductor light emitting element according to the embodiment.

FIG. 8A is a cross-sectional view showing the first semiconductor layer 11, the second semiconductor layer 12, and the light emitting layer 13 formed on the major surface of the substrate 10. For example, the MOCVD (metal organic chemical vapor deposition) method is used to sequentially grow the first semiconductor layer 11, the light emitting layer 13, and the second semiconductor layer 12 on the substrate 10. The substrate 10 is, for example, a silicon substrate. Also a sapphire substrate may be used as the substrate 10. The first semiconductor layer 11, the light emitting layer 13, and the second semiconductor layer 12 are, for example, a nitride semiconductor and contains gallium nitride (GaN).

The first semiconductor layer 11 is, for example, an n-type GaN layer. The first semiconductor layer 11 may have a stacked structure including a buffer layer provided on the substrate 10 and an n-type GaN layer provided on the buffer layer. The second semiconductor layer 12 includes, for example, a p-type AlGaN layer provided on the light emitting layer 13 and a p-type GaN layer provided on the p-type AlGaN layer.

Figure 8B:
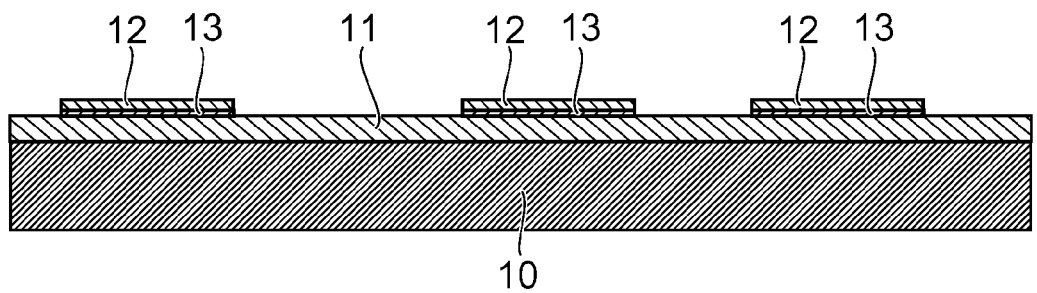
Figure 8C:
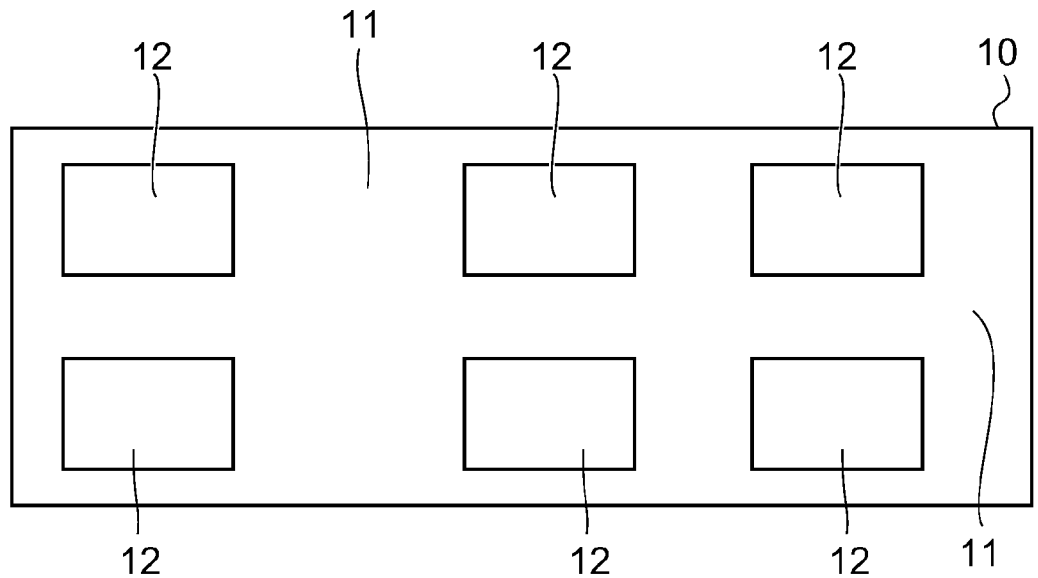

FIG. 8B and FIG. 8C show a state where the second semiconductor layer 12 and the light emitting layer 13 are selectively removed. FIG. 8B is a cross-sectional view, and FIG. 8C is a plan view showing the upper surface side of the substrate 10.

As shown in FIG. 8B, for example, the RIE (reactive ion etching) method is used to selectively etch the second semiconductor layer 12 and the light emitting layer 13 to expose the first semiconductor layer 11.

As shown in FIG. 8C, the semiconductor layer 12 and the light emitting layer 13 are patterned into an island configuration, and a plurality of light emitting regions (portions 15e including the light emitting layer 13) are formed on the substrate 10.

Figure 9A:
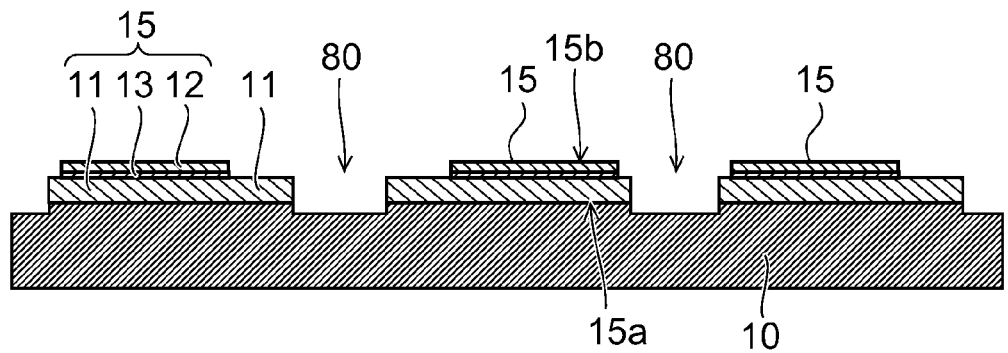
Figure 9B:
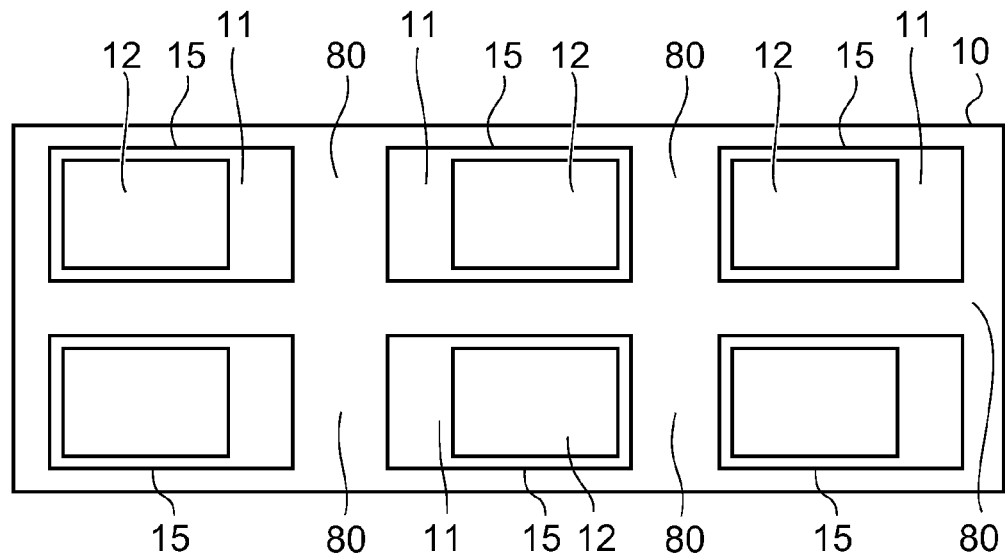

Next, as shown in FIG. 9A and FIG. 9B, the first semiconductor layer 11 is selectively removed to form a plurality of semiconductor layers 15 on the substrate 10.

FIG. 9A shows a cross-section of the substrate 10 and the semiconductor layer 15 formed thereon. For example, an etching mask (not shown) covering the second semiconductor layer 12 and the light emitting layer 13 is provided on the first semiconductor layer 11. Subsequently, the RIE method is used to etch the first semiconductor layer 11 to form a trench 80 with a depth reaching the substrate 10.

FIG. 9B shows the upper surface of the substrate 10 provided with the semiconductor layer 15. The trench 80 is provided in a lattice configuration on the substrate 10, and separates the first semiconductor layer 11 into a plurality of semiconductor layers 15.

The first surface 15a of the semiconductor layer 15 is a surface in contact with the substrate 10, and the second surface 15b is surfaces of the first semiconductor layer 11 and the second semiconductor layer 12. The trench 80 is formed by etching the upper surface of the substrate 10, and is provided in a position deeper than the first surface 15a.

Figure 10A:
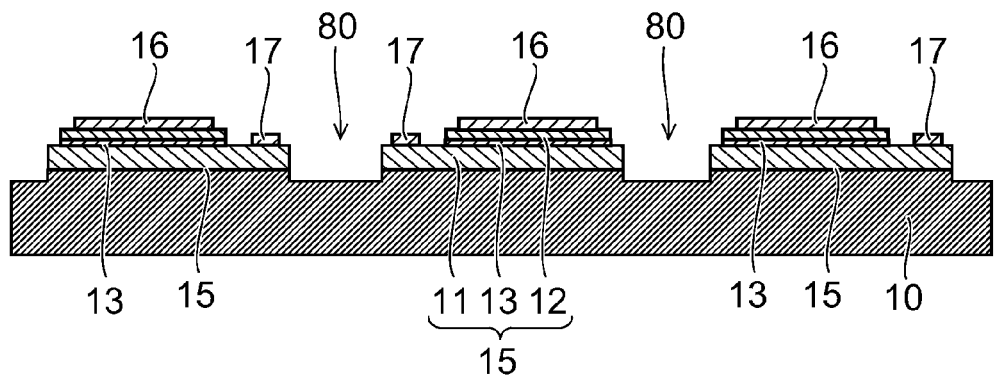
Figure 10B:
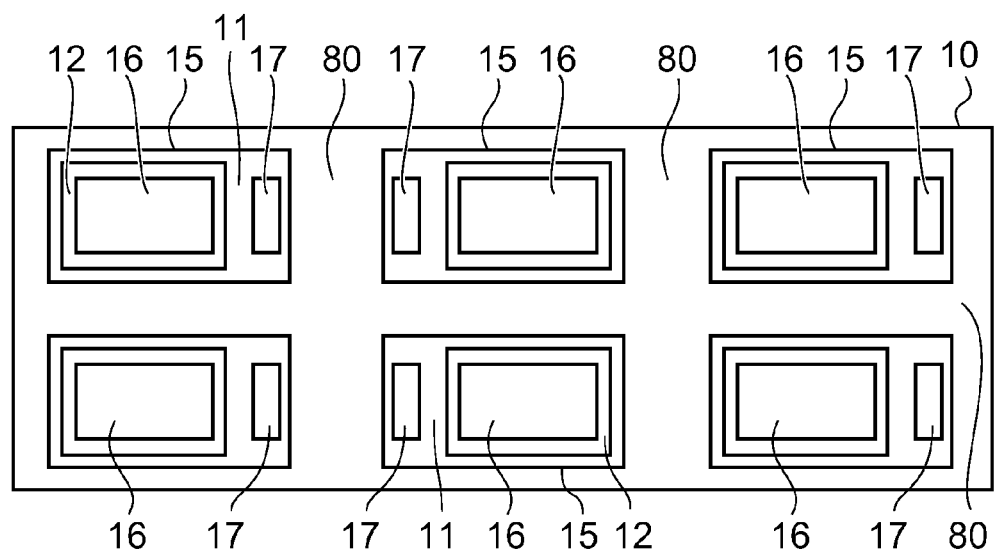

The trench 80 may be formed after the p-side electrode 16 and the n-side electrode 17 are formed (see FIGS. 10A and 10B).

Next, as shown in FIG. 10A and FIG. 10B, the p-side electrode 16 and the n-side electrode 17 are formed on the second surface 15b of the semiconductor layer 15. FIG. 10A is a cross-sectional view, and FIG. 10B is a plan view showing the upper surface of the substrate 10.

The p-side electrode 16 is formed on the second semiconductor layer 12. The n-side electrode 17 is formed on the first semiconductor layer 11. The p-side electrode 16 has a larger area than the n-side electrode.

The p-side electrode 16 and the n-side electrode 17 are formed by, for example, the sputtering method, the vapor deposition method, or the like. Either the p-side electrode 16 or the n-side electrode 17 may be formed earlier, or both may be formed simultaneously using the same material. The p-side electrode 16 is formed so as to reflect the emission light of the light emitting layer 13. The p-side electrode 16 contains, for example, silver, a silver alloy, aluminum, an aluminum alloy, or the like. To prevent the sulfuration and oxidation of the p-side electrode 16, a configuration including a metal protection film (barrier metal) may be used. To form an ohmic contact between each electrode and the semiconductor layer, heat treatment is performed as necessary.

Figure 11A:
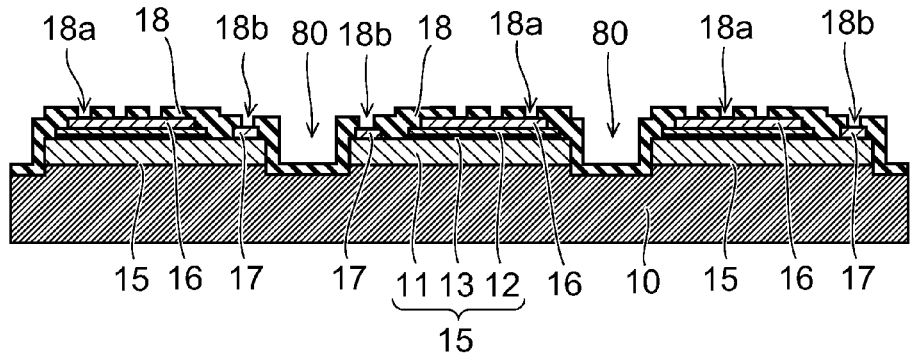

Next, as shown in FIG. 11A, the insulating film 18 is formed on the upper surface of the substrate 10. FIG. 11A is a schematic view showing a cross-section of the substrate 10 and the semiconductor layer 15.

The insulating film 18 covers the structure provided on the substrate 10, and has the first opening (hereinafter, the opening 18a) and the second opening (hereinafter, the opening 18b).

The insulating film 18 is, for example, a silicon oxide film or a silicon nitride film, and may be formed using the CVD (chemical vapor deposition) method. The openings 18a and 18b are formed by, for example, wet etching using a resist mask. The opening 18a leads to the p-side electrode 16. The opening 18b leads to the n-side electrode 17. In the embodiment, the insulating film 18 includes a plurality of openings 18a and one opening 18b.

Also an organic film of a polyimide or the like, for example, may be used as the insulating film 18. When an organic film of a photosensitive polyimide, benzocyclobutene, or the like is used for the insulating film 18, direct exposure and development can be performed. Therefore, the patterning of the openings 18a and 18b is easy.

Figure 11B:
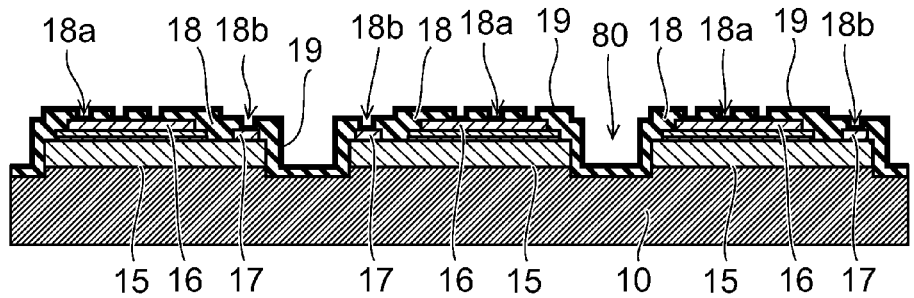
Figure 11C:
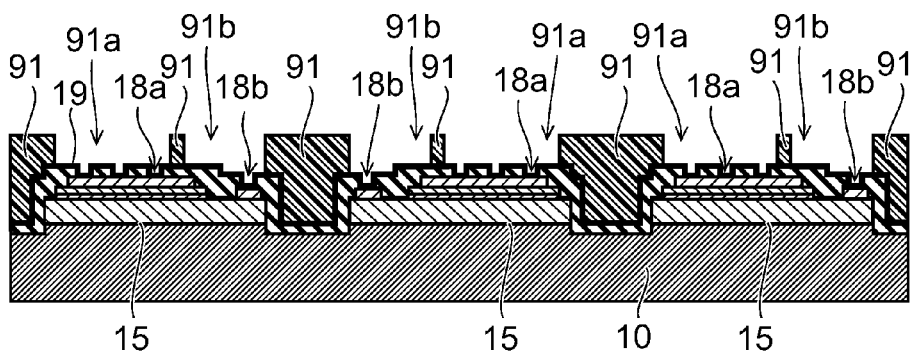
Figure 12A:
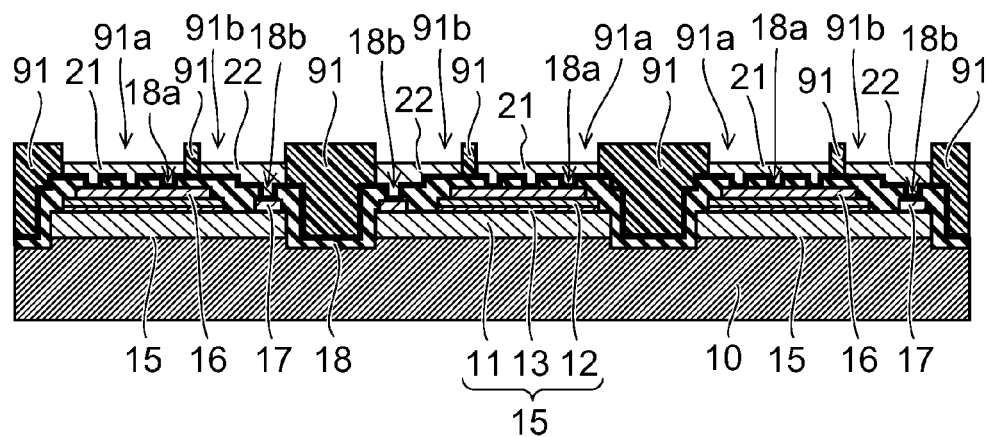
Figure 12B:
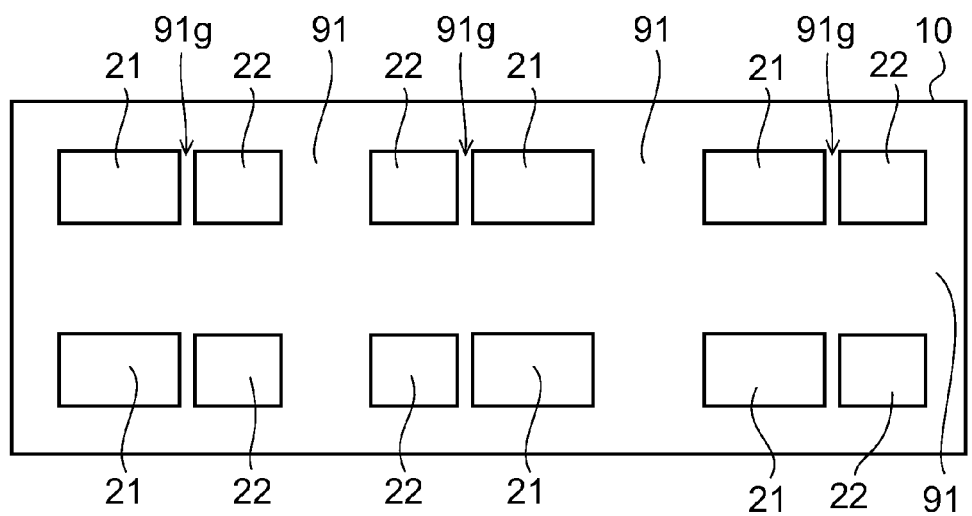

Next, FIG. 11B to FIG. 12B show the formation processes of the p-side interconnection layer 21 and the n-side interconnection layer 22. FIG. 11B to FIG. 12A are schematic views showing a cross-section of the substrate 10 and the semiconductor layer 15, and FIG. 12B is a plan view showing the upper surface of the substrate 10.

As shown in FIG. 11B, a metal film 19 is formed on the surface of the insulating film 18, the inner surface (side wall and bottom surface) of the first opening 18a, and the inner surface (side wall and bottom surface) of the second opening 18*b*. The metal film 19 functions as a seed metal in the plating process.

The metal film 19 is, for example, formed using the sputtering method so as to contain titanium (Ti) and copper (Cu) in this order from the insulating film 18 side. Aluminum may be used in place of titanium.

Next, as shown in FIG. 11C, a resist mask 91 is formed on the metal film 19. The resist mask 91 includes an opening 91*a* and an opening 91*b*. The opening 91*a* is provided on the p-side electrode 16, and the opening 91*b* is provided on the n-side electrode 17.

Subsequently, as shown in FIG. 12A and FIG. 12B, the p-side interconnection layer 21 and the n-side interconnection layer 22 are formed using electrolytic copper plating. That is, using the metal film 19 as a current path, a copper (Cu) layer is selectively formed in the openings 91*a* and 91*b* of the resist mask 91.

As shown in FIG. 12A, the p-side interconnection layer 21 is formed on the insulating film 18 and also in the opening 18*a*. The p-side interconnection layer 21 is electrically connected to the p-side electrode 16. The n-side interconnection layer 22 is formed on the insulating film 18 and also in the opening 18*b*. The n-side interconnection layer 22 is electrically connected to the n-side electrode 17.

As shown in FIG. 12B, the p-side interconnection layer 21 and the n-side interconnection layer 22 face each other across a resist mask 91*g*. That is, the spacing between the p-side interconnection layer 21 and the n-side interconnection layer 22 may be provided narrow up to the limit of photolithography.

Figure 13A:
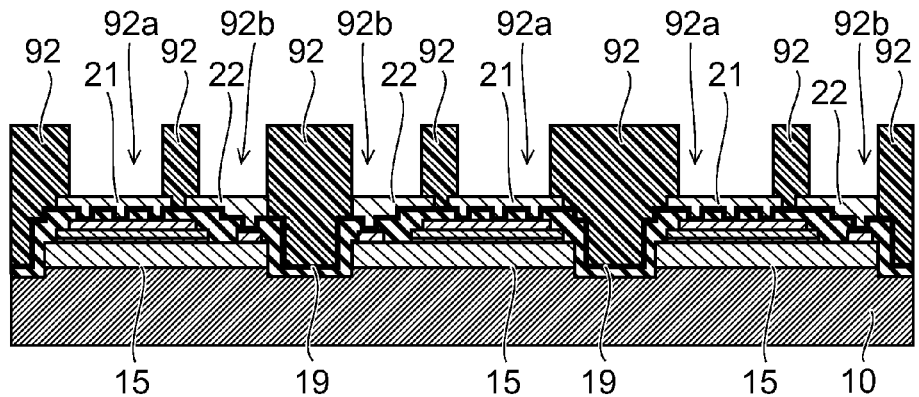
Figure 13B:
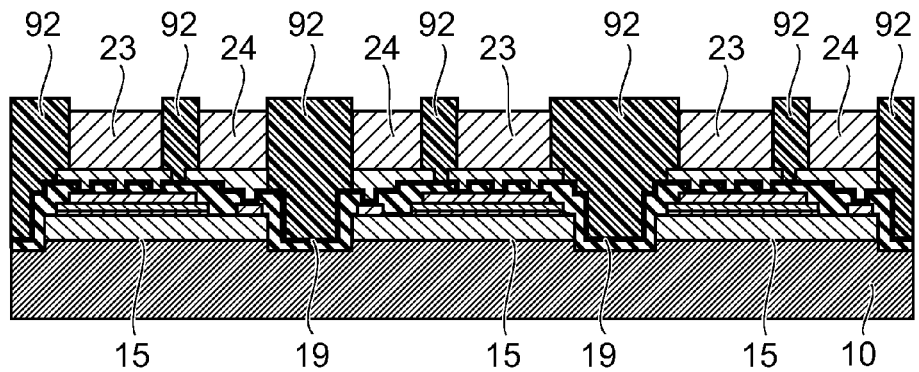
Figure 13C:
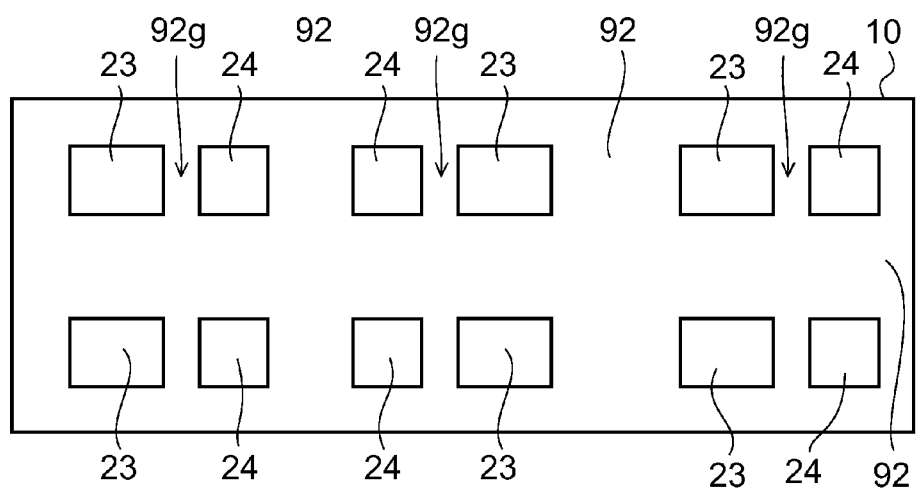

Next, FIG. 13A to FIG. 13C show the formation processes of the p-side interconnection layer 21 and the n-side interconnection layer 22. FIG. 13A and FIG. 13B are schematic views showing a cross-section of the substrate 10 and the semiconductor layer 15, and FIG. 13C is a plan view showing the upper surface of the substrate 10.

As shown in FIG. 13A, a resist mask 92 having an opening 92*a* and an opening 92*b* is formed. For example, after the resist mask 91 is removed using a solvent or oxygen plasma, photolithography is used to newly form the resist mask 92. The resist mask 92 may be formed also by stacking it on the resist mask 91.

Subsequently, as shown in FIG. 13B, the p-side metal pillar 23 and the n-side metal pillar 24 are formed in the openings 92*a* and 92*b*, respectively. The p-side metal pillar 23 and the n-side metal pillar 24 are formed using, for example, electrolytic Cu plating.

As shown in FIG. 13C, the p-side metal pillar 23 and the n-side metal pillar 24 face each other across a resist mask 92*g*. The spacing between the p-side metal pillar 23 and the n-side metal pillar 24 is formed wider than the spacing between the p-side interconnection layer 21 and the n-side interconnection layer 22 in order to prevent a short circuit during mounting.

Figure 14A:
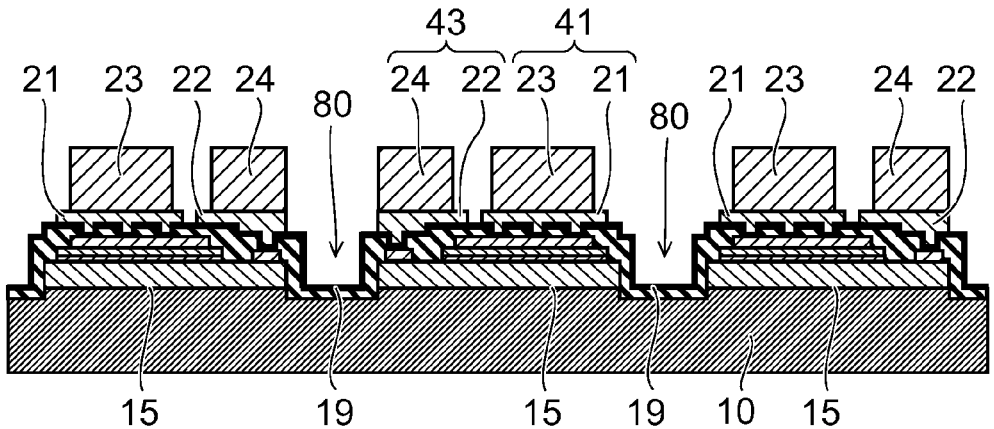
Figure 14B:
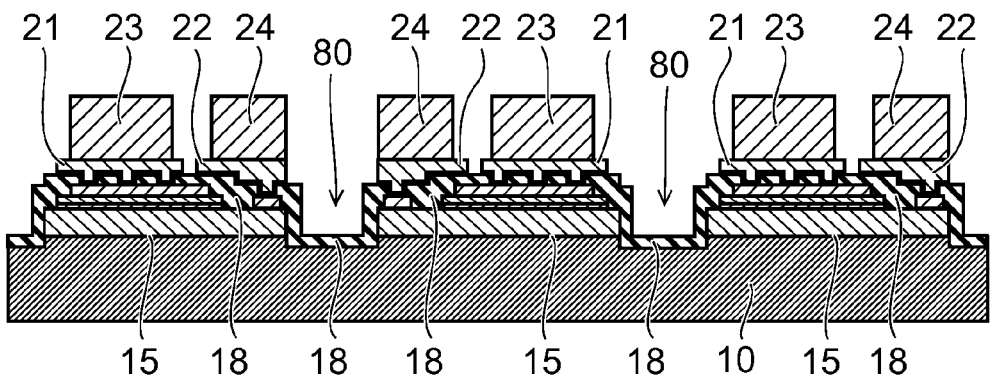
Figure 14C:
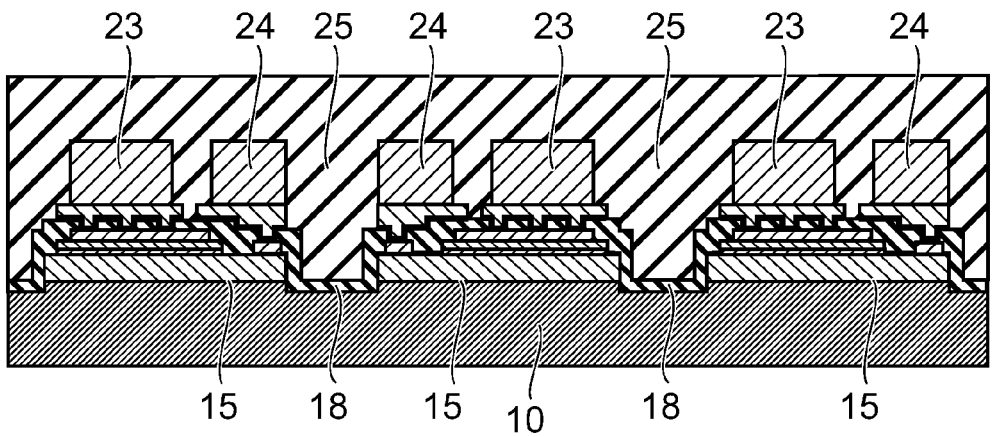

FIG. 14A to FIG. 14C are schematic cross-sectional views showing processes continuing from FIG. 13C. As shown in FIG. 14A, the resist mask 92 is removed using, for example, a solvent or oxygen plasma. Subsequently, as shown in FIG. 14B, the exposed portion of the metal film 19 is removed by wet etching using the metal pillar 23, the n-side metal pillar 24, the p-side interconnection layer 21, and the n-side interconnection layer 22 as a mask. Thereby, the electrical connection between the p-side interconnection layer 21 and the n-side interconnection layer 22 is cut off.

Next, as shown in FIG. 14C, the second insulating film (hereinafter, the insulating film 25) is stacked on the insulating film 18. The insulating film 25 covers the p-side interconnection layer 21, the n-side interconnection layer 22, the p-side metal pillar 23, and the n-side metal pillar 24.

The insulating film 25 insulates the n-side interconnection unit 43 from the p-side interconnection unit 41. The insulating film 25 contains, for example, carbon black, and blocks the emission light of the light emitting layer 13. The insulating film 25 may contain, for example, a material that reflects the emission light of the light emitting layer 13, such as titanium oxide.

Figure 15A:
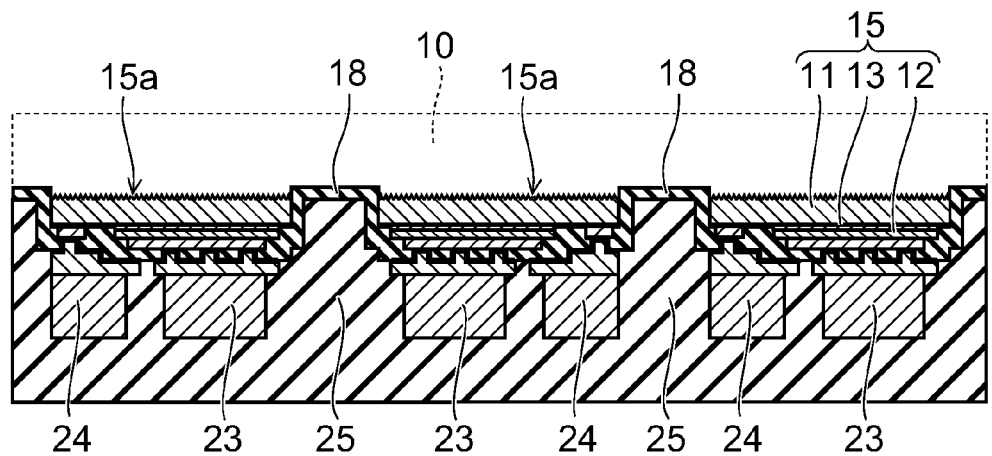
Figure 15B:
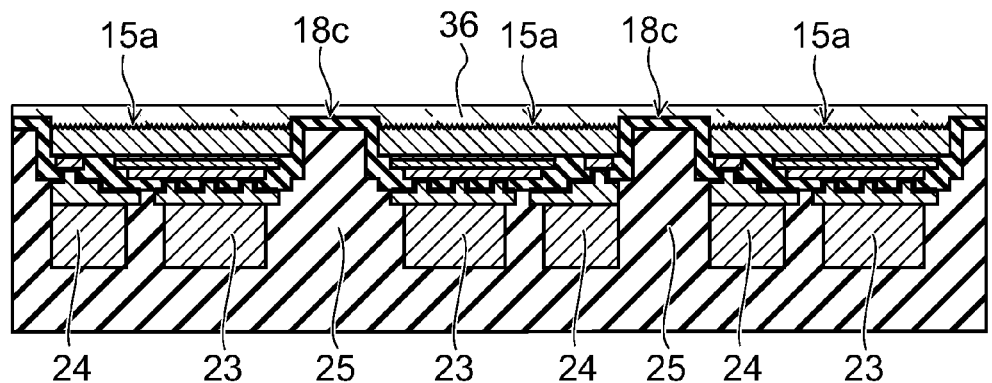

Next, as shown in FIG. 15A to FIG. 15B, the processing of the first surface 15*a* side of the semiconductor layer 15 is performed. FIG. 15A and FIG. 15B are schematic cross-sectional views showing the processes.

As shown in FIG. 15A, the substrate 10 is removed from the semiconductor layer 15. In the case where the substrate 10 is a silicon substrate, for example, the substrate 10 can be selectively removed by wet etching. In the case where the substrate 10 is a sapphire substrate, for example, the substrate 10 is removed using the laser lift-off method.

The structure formed on the substrate 10 is still supported by the insulating film 25 after the substrate 10 is removed, and keeps the wafer state. The semiconductor layer 15 is supported by the p-side metal pillar 23, the n-side metal pillar 24, and the insulating film 25. These are materials more flexible than the semiconductor layer 15, and relax the stress of the semiconductor layer 15. For example, a semiconductor layer epitaxially grown on the substrate 10 includes a large internal stress. Even when the stress is released at once during the peeling of the substrate 10, the p-side metal pillar 23, the n-side metal pillar 24, and the insulating film 25 absorb the stress. Therefore, damage to the semiconductor layer 15 in the process of removing the substrate 10 can be avoided.

Next, fine unevenness is formed on the first surface 15*a* of the semiconductor layer 15. For example, the first semiconductor layer 11 is wet-etched with a KOH (potassium hydroxide) aqueous solution, TMAH (tetramethylammonium hydroxide), or the like. In this etching, a difference in the etching rate depending on the crystal plane direction occurs. Consequently, as shown in FIG. 15A, unevenness can be formed on the first surface 15*a*. It is also possible to form a resist mask on the first surface 15*a* to selectively etch the surface of the first semiconductor layer 11. Thus, by forming unevenness on the first surface 15*a*, the extraction efficiency of the emission light of the light emitting layer 13 can be improved.

Next, as shown in FIG. 15B, the insulating layer 36 is formed on the first surface 15*a*. The insulating layer 36 contains, for example, a silicone resin or an epoxy resin, and covers the unevenness provided on the first surface 15*a*.

The insulating film 18 between adjacent semiconductor layers 15 is the portion formed on the bottom surface of the trench 80. Therefore, the upper surface 18*c* of the insulating film 18 in FIG. 15B protrudes above the first surface 15*a*. Thus, in the insulating layer 36, the portion provided on the insulating film 18 is thinner than the portion provided on the first surface 15*a*.

The insulating layer 36 may be, for example, also an inorganic film such as a silicon oxide film and a silicon nitride film.

Subsequently, on the second surface 15*b* side of the semiconductor layer 15, the surface of the insulating film 25 is ground to expose the p-side metal pillar 23 and the n-side metal pillar 24. The exposed surface of the p-side metal pillar 23 is the p-side external terminal 23*a*, and the exposed surface of the n-side metal pillar 24 is the n-side external terminal 24*a*.

Figure 16A:
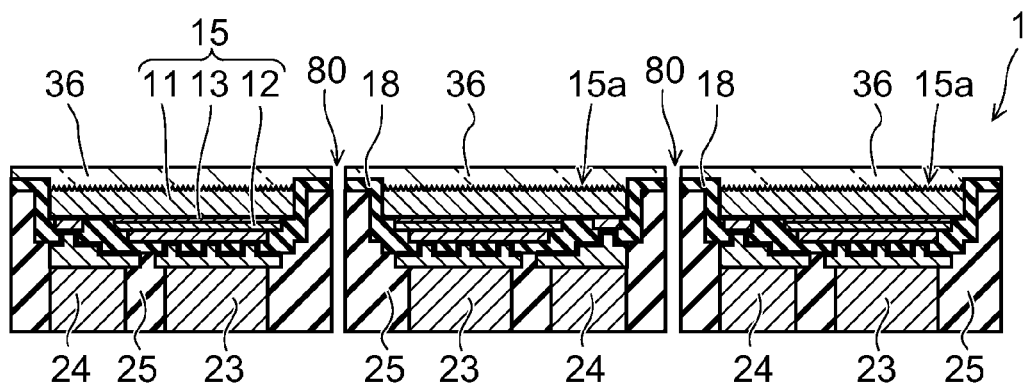
Figure 16B:
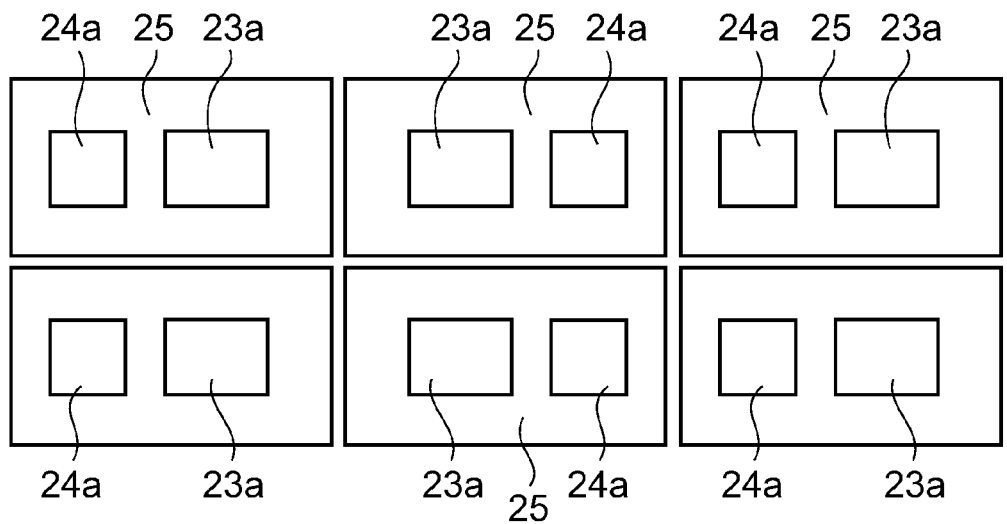

Next, as shown in FIG. 16A and FIG. 16B, the insulating layer 36, the insulating film 18, and the insulating film 25 are cut between adjacent semiconductor layers 15. Thereby, the semiconductor light emitting element 1 including the semiconductor layer 15 is fragmented. FIG. 16A shows cross-sections of semiconductor light emitting elements 1, and FIG. 16B shows the surface of the insulating film 25 at which the p-side external terminal 23a and the n-side external terminal 24a are exposed.

The cutting of the insulating layer 36, the insulating film 18, and the insulating film 25 is performed using, for example, a dicing blade. The cutting may be performed also by laser irradiation.

The semiconductor layer 15 does not exist in the trench 80, and is therefore free from damage caused by dicing. On being fragmented, a structure in which the end (side surface) of the semiconductor layer 15 is covered and protected by the insulating film 18 is obtained.

Since the processes before dicing are performed collectively in a wafer state, there is no need to perform wiring and packaging for each fragmented device, and a significant cost reduction is possible. That is, at the stage of being fragmented, wiring and packaging have already been performed. Therefore, the embodiment can enhance productivity and can reduce manufacturing costs.

Although the embodiment mentioned above illustrates examples in which the semiconductor light emitting element 1 is disposed on the mounting substrate 150, the embodiment is not limited thereto. For example, a semiconductor light emitting element including a p-side electrode and an n-side electrode on the opposite side to the mounting surface is possible. Also a semiconductor light emitting element having a vertical structure in which a p-side electrode and an n-side electrode are provided on the first surface side and the second surface side, respectively, of a semiconductor layer is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a mounting substrate having a mounting surface;
a plurality of semiconductor light emitting elements disposed on the mounting surface, each of the plurality of semiconductor light emitting elements comprising:
a semiconductor layer including a light emitting layer;
a p-side electrode connected to the semiconductor layer;
a p-side interconnection unit;
an n-side electrode connected to the semiconductor layer; and
an n-side interconnection unit;
a first resin provided on the mounting surface between adjacent ones of the plurality of semiconductor light emitting elements, the first resin containing a phosphorescent substance capable of being excited by emission light of the light emitting layer; and
a second resin provided on the first resin and the plurality of semiconductor light emitting elements, the second resin containing a fluorescent body capable of being excited by the emission light of the light emitting layer.

2. The device according to claim 1, wherein a light emission time of the phosphorescent substance is longer than a light emission time of the fluorescent body.

3. The device according to claim 1, wherein a peak wavelength of emission light of the phosphorescent substance is longer than a peak wavelength of emission light of the light emitting layer.

4. The device according to claim 3, wherein a peak wavelength of emission light of the phosphorescent substance is the same as a peak wavelength of emission light of the fluorescent body.

5. The device according to claim 1, wherein the first resin covers an entirety of each of the plurality of semiconductor light emitting elements.

6. The device according to claim 1, wherein the semiconductor layer has a first surface that emits emission light of the light emitting layer and a second surface on an opposite side to the first surface, wherein the p-side interconnection unit and the n-side interconnection unit are provided on the second surface side, and wherein each of the plurality of semiconductor elements is mounted such that the second surface thereof is opposed to the mounting surface.

7. The device according to claim 6, wherein the first surface of the semiconductor layer has unevenness.

8. The device according to claim 6, wherein the first resin covers the first surface of the semiconductor layer.

9. The device according to claim 6, wherein each of the plurality of semiconductor light emitting elements further comprises a layer that is provided on the first surface and that transmits the emission light of the light emitting layer, and
wherein the layer that transmits the emission light of the light emitting layer includes a scatterer that scatters the emission light of the light emitting layer.

10. The device according to claim 6, wherein each of the plurality of semiconductor light emitting elements further comprises a first insulating film covering the semiconductor layer, the p-side electrode, and the n-side electrode, wherein the p-side interconnection unit penetrates through the first insulating film to be electrically connected to the p-side electrode, and wherein the n-side interconnection unit penetrates through the first insulating film to be electrically connected to the n-side electrode.

11. The device according to claim 10, wherein each of the plurality of semiconductor light emitting elements further comprises a second insulating film provided between the p-side interconnection unit and the n-side interconnection unit.

12. The device according to claim 11, wherein the second insulating film covers a periphery of the p-side interconnection unit and a periphery of the n-side interconnection unit.

13. The device according to claim 10, wherein the p-side interconnection unit comprises:
a p-side interconnection layer connected to the p-side electrode; and
a p-side metal pillar which is provided on the p-side interconnection layer and is thicker than the p-side interconnection layer; and
wherein the n-side interconnection unit comprises:
an n-side interconnection layer connected to the n-side electrode; and
an n-side metal pillar which is provided on the n-side interconnection layer and is thicker than the n-side interconnection layer.

14. The device according to claim 13, wherein each of the plurality of semiconductor light emitting elements further comprises a second insulating film provided between the p-side interconnection unit and the n-side interconnection unit, the second insulating film covering a side surface of the p-side metal pillar and a side surface of the n-side metal pillar.

* * * * *